United States Patent
von Borcke (10) Patent No.: US 9,425,784 B2
(45) Date of Patent: Aug. 23, 2016

(54) CIRCUIT HAVING A POWER TRANSISTOR AND A DRIVE CIRCUIT

(75) Inventor: Mathias von Borcke, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1245 days.

(21) Appl. No.: 11/968,853

(22) Filed: Jan. 3, 2008

(65) Prior Publication Data

US 2008/0164497 A1  Jul. 10, 2008

(30) Foreign Application Priority Data

Jan. 4, 2007  (DE) .......................... 10 2007 001 107

(51) Int. Cl.
| | | |
|---|---|---|
| H01L 29/66 | (2006.01) | |
| H03K 17/14 | (2006.01) | |
| H03K 17/16 | (2006.01) | |
| H03K 17/18 | (2006.01) | |
| H03K 17/0412 | (2006.01) | |
| H03K 17/0812 | (2006.01) | |

(52) U.S. Cl.
CPC .............. *H03K 17/14* (2013.01); *H03K 17/162* (2013.01); *H03K 17/18* (2013.01); *H03K 17/04123* (2013.01); *H03K 17/08122* (2013.01); *H03K 17/145* (2013.01); *H03K 17/163* (2013.01)

(58) Field of Classification Search
CPC ..... H03K 17/14; H03K 17/18; H03K 17/162; H03K 17/163; H03K 17/145; H03K 17/04123; H03K 17/08122

USPC ......... 257/263, 271, 273, 287, 288, 341, 401, 257/E27.015; 327/108, 109, 512, 513
See application file for complete search history.

(56) References Cited

U.S. PATENT DOCUMENTS

| | | | |
|---|---|---|---|
| 5,543,632 A | 8/1996 | Ashley | |
| 5,656,960 A | 8/1997 | Holzer | |
| 2005/0041353 A1* | 2/2005 | Finney | H03K 17/0822 361/103 |
| 2006/0163652 A1* | 7/2006 | Lowis | H01L 24/06 257/341 |
| 2006/0226888 A1* | 10/2006 | Watanabe | G01K 7/21 327/512 |
| 2006/0255361 A1* | 11/2006 | Oyabe | G01K 7/015 257/139 |
| 2007/0030049 A1* | 2/2007 | Yoshikawa | G01K 7/01 327/512 |
| 2007/0064369 A1* | 3/2007 | Devarajan | H03K 17/08 361/103 |

FOREIGN PATENT DOCUMENTS

| | | |
|---|---|---|
| DE | 10346307 B3 | 12/2004 |
| DE | 10 2005 014 725 B3 | 8/2006 |

* cited by examiner

*Primary Examiner* — Vongsavanh Sengdara
(74) *Attorney, Agent, or Firm* — Dicke, Billig & Czaja, PLLC (57) ABSTRACT

A circuit having a power transistor and drive circuit is disclosed. One embodiment provides a drive terminal and a load path. The power transistor is integrated in a first semiconductor body. A first sensor arrangement having a sensor transistor is integrated in the first semiconductor body. The sensor arrangement provides a first sensor signal dependent on a threshold voltage of the sensor transistor. A drive circuit to which the first sensor signal is supplied and designed to drive the power transistor via its drive terminal as a function of the first sensor signal.

25 Claims, 7 Drawing Sheets

27
CIRCUIT HAVING A POWER TRANSISTOR AND A DRIVE CIRCUIT

CROSS-REFERENCE TO RELATED APPLICATIONS

This Utility patent application claims priority to German Patent Application No. DE 10 2007 001 107.7-31 filed on Jan. 4, 2007, which is incorporated herein by reference.

BACKGROUND

When power transistors which are used to supply a voltage to a load are switched on and off, there is on the one hand the aim, in order to avoid switching losses, of keeping the switching processes, that is to say the transitional phases between the two switching states, as short as possible. On the other hand, steep switching flanks of the voltage across the power transistor and of the current flowing through the power transistor should be avoided in order to reduce electromagnetic interference radiation that occurs during the switching processes.

The switching processes can be optimized taking account of these two conditions by a gate electrode of the power transistor being charged with a different control current before a gate-source voltage reaches the value of the threshold voltage of the transistor, in the same way as after this threshold voltage is reached.

A drive such as this requires information about the value of the threshold voltage of the power transistor. However, this threshold voltage is governed by the production process for the power transistor and, furthermore, is subject to a not-inconsiderable process-dependent scatter, and is dependent on the temperature. The storage of information about the threshold voltage in the drive circuit is therefore impossible at the manufacturer, or is possible only with considerable complexity.

SUMMARY

A circuit according to one or more embodiments includes a power transistor with a drive terminal and a load path, with the power transistor being integrated in a first semiconductor body, and a first sensor arrangement with a sensor transistor which is integrated in the first semiconductor body. This first sensor arrangement produces a first sensor signal, which is dependent on the threshold voltage of the sensor transistor and is supplied to a drive circuit which is designed to drive the power transistor via its drive terminal as a function of the first sensor signal.

This arrangement makes use of the fact that the threshold voltage of the power transistor and the threshold voltage of the sense transistor are subject to the same process-dependent fluctuations as a result of being integrated in a common semiconductor body, so that the threshold voltage of the sense transistor directly represents a measure of the threshold voltage of the power transistor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
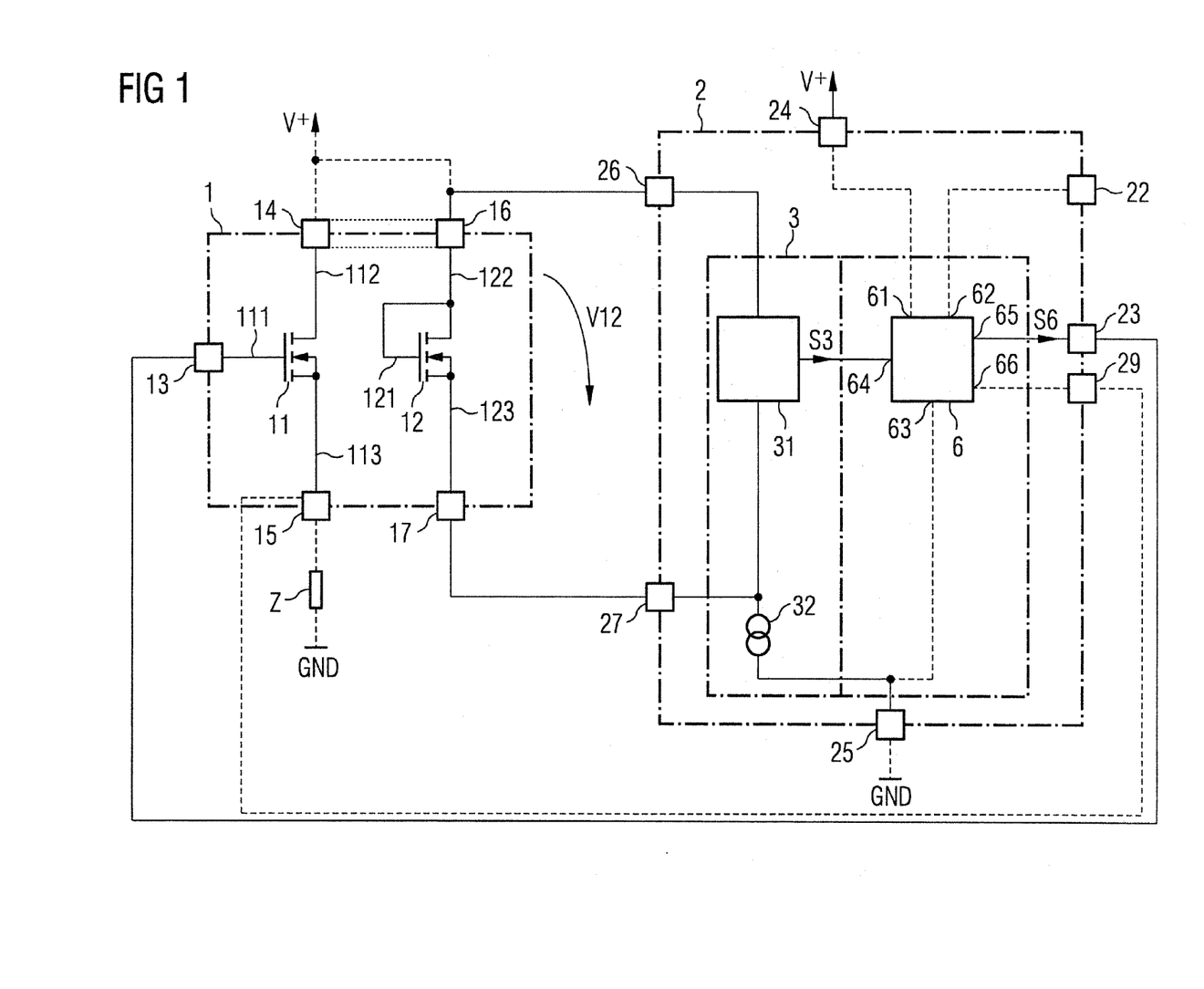
FIG. 1 illustrates an electrical equivalent circuit of a circuit arrangement which has a power transistor, a sensor arrangement with a sensor transistor and a drive circuit for the power transistor.

FIG. 1 illustrates a first exemplary embodiment of a circuit arrangement which has a power transistor 11, a sensor arrangement with a sensor transistor 12, and a drive circuit 6 for the power transistor 11. In the example, the power transistor 11 is an MOS transistor, specifically an n-channel MOSFET, and has a gate terminal 111 as the control terminal, as well as a drain and a source terminal 112, 113 as load terminals. A load path of this transistor 11 runs between the drain and source terminals 112, 113.

The power transistor 11 is integrated in a first semiconductor body or semiconductor chip 1, which is illustrated schematically in FIG. 1 by a dashed-dotted line, and has connecting contacts or connecting pads 13, 14, 15 for the gate terminal 111 and the drain and source terminals 112, 113 of the power transistor 11. The sensor transistor 12 is integrated together with the power transistor 11 in the first semiconductor body 1, and a transistor of the same transistor type as the power transistor, that is to say an n-channel MOSFET in the illustrated example. This sensor transistor has a gate terminal 121, a drain terminal 122 and a source terminal 123, and is connected as a MOS diode by connecting the gate terminal 121 to the drain terminal 122. The load path or drain-source path 122-123 in this sensor transistor 12 is connected between connecting pads 16, 17 of the first semiconductor chip 1 in the example.

In addition to the sensor transistor 12, the first sensor arrangement has an evaluation circuit 31 which is connected to the drain and source terminals 122, 123 of the sensor transistor 12 and, during operation of the circuit arrangement, produces a first sensor signal S3 which is dependent on the voltage V12 dropped across the drain-source path through the sensor transistor 12. On the assumption that the power transistor 11 and the sensor transistor 12 of the first semiconductor chip 1 have been produced by identical processes carried out at the same time, and that these two transistors are subject to the same temperatures during operation, it can be assumed that the threshold voltage of the power transistor 11 corresponds to the threshold voltage of the sensor transistor 12. When current is flowing through the sensor transistor 12, the load-path voltage V12 across this sensor transistor 12 corresponds to the threshold voltage of the sensor transistor 12, and therefore to the threshold voltage of the power transistor 11.

The evaluation circuit 3 in the first sensor arrangement has a voltage measurement arrangement 31 which is connected between the drain and source terminals 122, 123 of the sensor transistor 12, detects the voltage V12 between these two terminals 122, 123 and produces the first sensor signal S3, which is dependent on this voltage V12. In order to impress a current flow on the sensor transistor 12 which results in the voltage V12, corresponding to the threshold voltage, across its load path, the evaluation circuit 3 has a current source 32 which is connected to one of the load terminals, in the example to the source terminal 123, of the sensor transistor 12, and is therefore connected in series with the load path of this sensor transistor 12.

The sensor transistor 12 and the evaluation circuit 3 in the first sensor arrangement are arranged in separate semiconductor bodies. The sensor transistor 12 is integrated together with the load transistor 11 in the first semiconductor body, while the evaluation circuit 3 is integrated in a second semiconductor body, which is illustrated schematically by a dashed-dotted line in FIG. 1. The evaluation circuit 3 in the first sensor arrangement is in this case connected to connecting pads 26, 27 of the second semiconductor body 2, which are connected via line connections, for example bonding wires, to the connecting pads 16, 17 of the load path of the sensor transistor 12.

In order to drive the load transistor 11, the circuit arrangement has a drive circuit 6 which is integrated in the second semiconductor body 2, is supplied with the first sensor signal S3 via a first input 64, and produces, at an output 65, a drive signal S6 for the load transistor 11. The output 65 of the drive circuit 6 is in this case connected to an output pad 23 of the second semiconductor chip 2, which is connected via a line connection, for example a bonding wire, to an input pad 13 of the first semiconductor chip 1. The gate terminal 111 of the load transistor 11 is in this case connected to this input pad 13 of the first semiconductor chip 1. The drive circuit 6 may be a conventional drive circuit which is designed to drive the load transistor 11 taking account of the threshold voltage of the load transistor 11, with the difference that the information about the threshold voltage of the load transistor 11 is not already stored in the drive circuit 6 in advance and, instead, this information is supplied to the drive circuit 6 via the first sensor signal S3.

The reference symbols 61, 63 of the drive circuit 6 in FIG. 1 denote supply terminals for application of a supply voltage to the drive circuit 6. These supply terminals 61, 63 are, for example, connected to supply pads 24, 25 on the second semiconductor chip 2. During operation of the circuit arrangement, a supply voltage is applied to these supply pads 24, 25 by, for example, connecting a first supply pad 24 to a positive supply potential V+, and a second supply pad 25 to a negative supply potential, or reference ground potential GND. The current source 32 of the evaluation circuit 3 is in this case connected to this second supply pad 25.

The reference symbol 62 for the drive circuit 6 denotes a signal input for supplying a control signal, on the basis of which the drive circuit 6 switches the load transistor 11 on or off. This control signal can be supplied to the second semiconductor chip 2 via a further input pad 22 and may, for example, be a binary signal, with the drive circuit being designed to switch the load transistor 11 on when this control signal is at a first signal level, and to switch it off when this control signal is at a second signal level. The switching speed, that is to say the rate at which the drive circuit 6 changes the load transistor 11 from one switching state to another switching state, is in this case dependent on the first sensor signal S3 and therefore on the threshold voltage of the sensor transistor 12. For example, the drive circuit can thus be designed to first of all charge the gate electrode with a first charging current, when the load transistor 11 is switched on, until the gate-source voltage of the transistor 11 reaches the threshold voltage or reaches a value which is lower than the threshold voltage by a predetermined value, and then to charge the gate electrode with a second charging current, which is less than the first charging current, until the gate-source voltage reaches a value which is higher than the threshold voltage by a predetermined value, and then to charge the gate electrode with the first charging current or another charging current, which is greater than the second charging current.

The switching-off process takes place, for example, in the opposite sense, that is to say first of all with a first discharge current until a predetermined value above the threshold value is reached, then with a lower second discharge current until a predetermined value below the threshold voltage is reached, and then with a third discharge current, which is higher than the second discharge current. In order to detect the gate-source voltage of the load transistor, the drive circuit may have a further input 66, which is connected via a further connecting pad of the second semiconductor chip 2 to the source terminal of the transistor 11, or to the source connecting pad 15 of the first semiconductor chip 1.

FIG. 1 illustrates the use of the circuit arrangement that has been explained, in order to supply voltage to a load Z. The load transistor 11 is in this case connected as a high-side switch whose load path is connected between a terminal for the positive supply potential V+ and the load Z. The terminal of the load Z remote from the load transistor is in this case connected to a terminal for the negative supply potential or reference ground potential GND. The load connecting pads 14, 16, which are connected to the drain terminals of the load transistor 11 and of the sensor transistor 12, may in this case be a common terminal, as is illustrated by dotted lines in FIG. 1.

Figure 2:
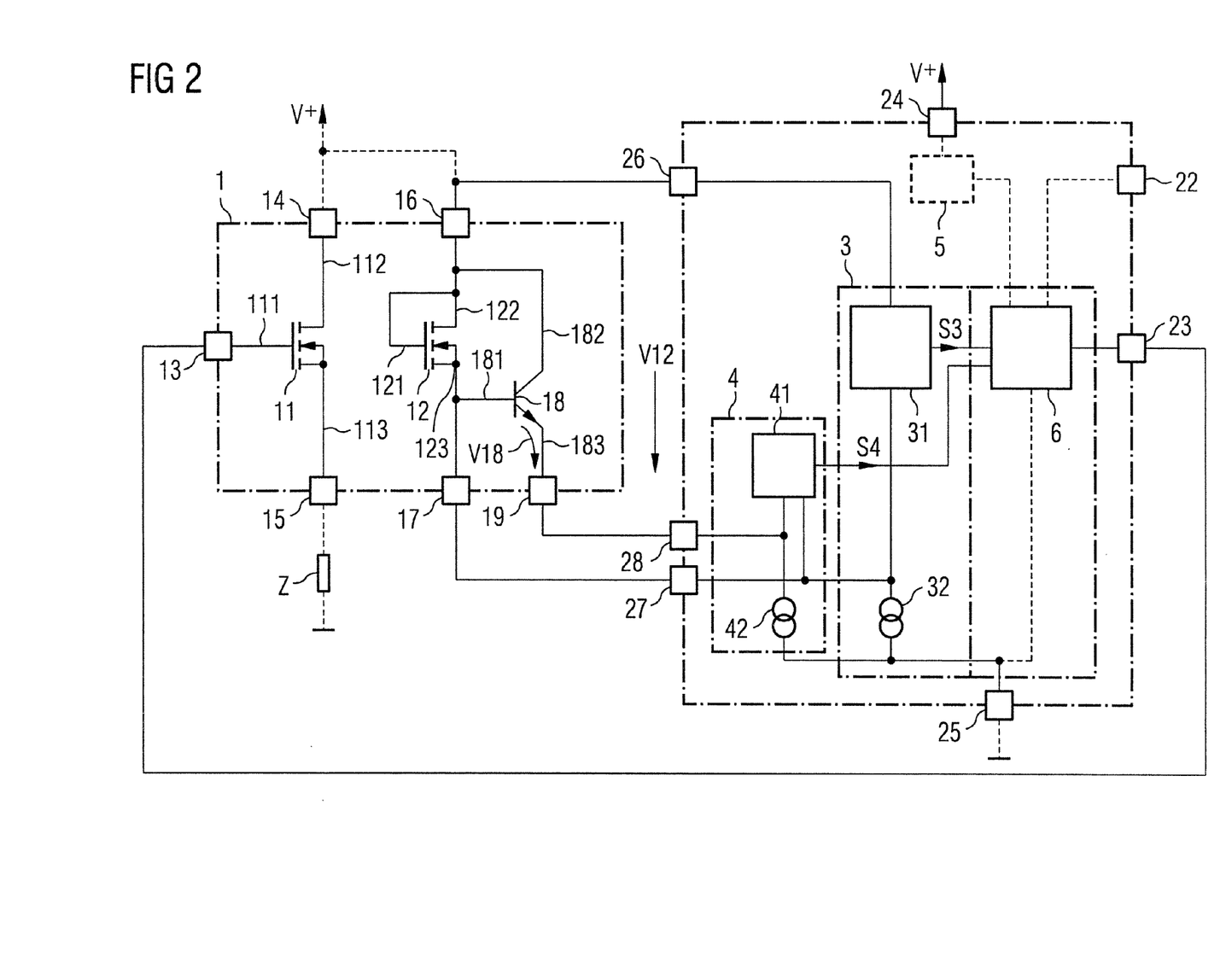
FIG. 2 illustrates a further exemplary embodiment of a circuit arrangement which has a further sensor arrangement with a temperature sensor.

FIG. 2 illustrates a further exemplary embodiment of a circuit arrangement. This circuit arrangement differs from that illustrated in FIG. 1 by the presence of a second sensor arrangement 18, 4, which produces a second sensor signal S4 which is dependent on a temperature in the first semiconductor chip 1. This second sensor arrangement has a temperature sensor which, in the example, is a bipolar transistor 18 with a base terminal 181, a collector terminal 182 and an emitter terminal 183. A temperature measurement by using this bipolar transistor 18 is based on the base-emitter voltage of a bipolar transistor in which a constant emitter current is forced to flow varying with the temperature. The second sensor arrangement in this case includes an evaluation circuit 4 with a voltage measurement arrangement 41 and a current source 42. The current source 42 is connected in series with the collector-emitter path through the bipolar transistor 18 and is used to force a constant emitter current to flow through the bipolar transistor 18 during operation of the circuit arrangement. The voltage measurement arrangement 41 is used to measure the base-emitter voltage V18 which results from the emitter current and is dependent on the temperature, and to produce a second sensor signal S4 which is dependent on this voltage V18. The bipolar transistor 18 in this second sensor arrangement is integrated in the first semiconductor chip 1 with the load transistor 11 and the sensor transistor 12, while the evaluation circuit 4 is integrated with the voltage measurement arrangement 41 and the current source 42 in the second semiconductor chip 2.

The collector terminal 182 of the bipolar transistor 18 that is used as a temperature sensor is connected to the drain terminal of the sensor transistor 12, and the base terminal 181 of this bipolar transistor 18 is connected to the source terminal 123 of the sensor transistor 12. Just one additional connecting pad 19 is therefore required on the first semiconductor chip 1 in order to detect the base-emitter voltage V18 across the bipolar transistor 18 by using the voltage measurement arrangement 41, with the emitter terminal of the bipolar transistor 18 being connected to this additional connecting pad 19. In this case, the voltage measurement arrangement 41 detects the voltage between the connecting pad 17, which is used jointly by the source terminal of the sensor transistor 12 and the base terminal 181 of the bipolar transistor 18, and the emitter connecting pad 19 of the first semiconductor chip 1. The voltage measurement arrangement 41 of the second sensor arrangement is connected together with the voltage measurement arrangement 31 of the first sensor arrangement to the connecting pad 27. A further connecting pad 28 is provided on the second semiconductor chip 2 in order to connect the voltage measurement arrangement 41 of the second sensor arrangement to the emitter connecting pad 19 on the first semiconductor chip 1, and is connected to the emitter connecting pad 19 by a line connection, for example a bonding wire.

The second sensor signal S4, which indicates a temperature in the first semiconductor chip 1, is supplied to the drive circuit 6, which drives the load transistor 11 as a function of this second sensor signal S4. By way of example, the drive circuit 6 may be designed to switch the load transistor 11 off when the second sensor signal S4 indicates a rise in a temperature in the first semiconductor chip 1 above a predetermined threshold value.

As is illustrated by dashed lines in FIG. 2, the second semiconductor chip with the evaluation circuits 3, 4 integrated in it and with the drive circuit 6 may have a voltage supply circuit 5 which is connected to one of the supply pads 24 of the second semiconductor chip 2 and is designed to produce a supply voltage for the integrated circuit components in the second semiconductor chip 2. This voltage supply circuit 5, as representative of these circuit components, is connected to the drive circuit 6 in the circuit illustrated in FIG. 2.

Figure 3:
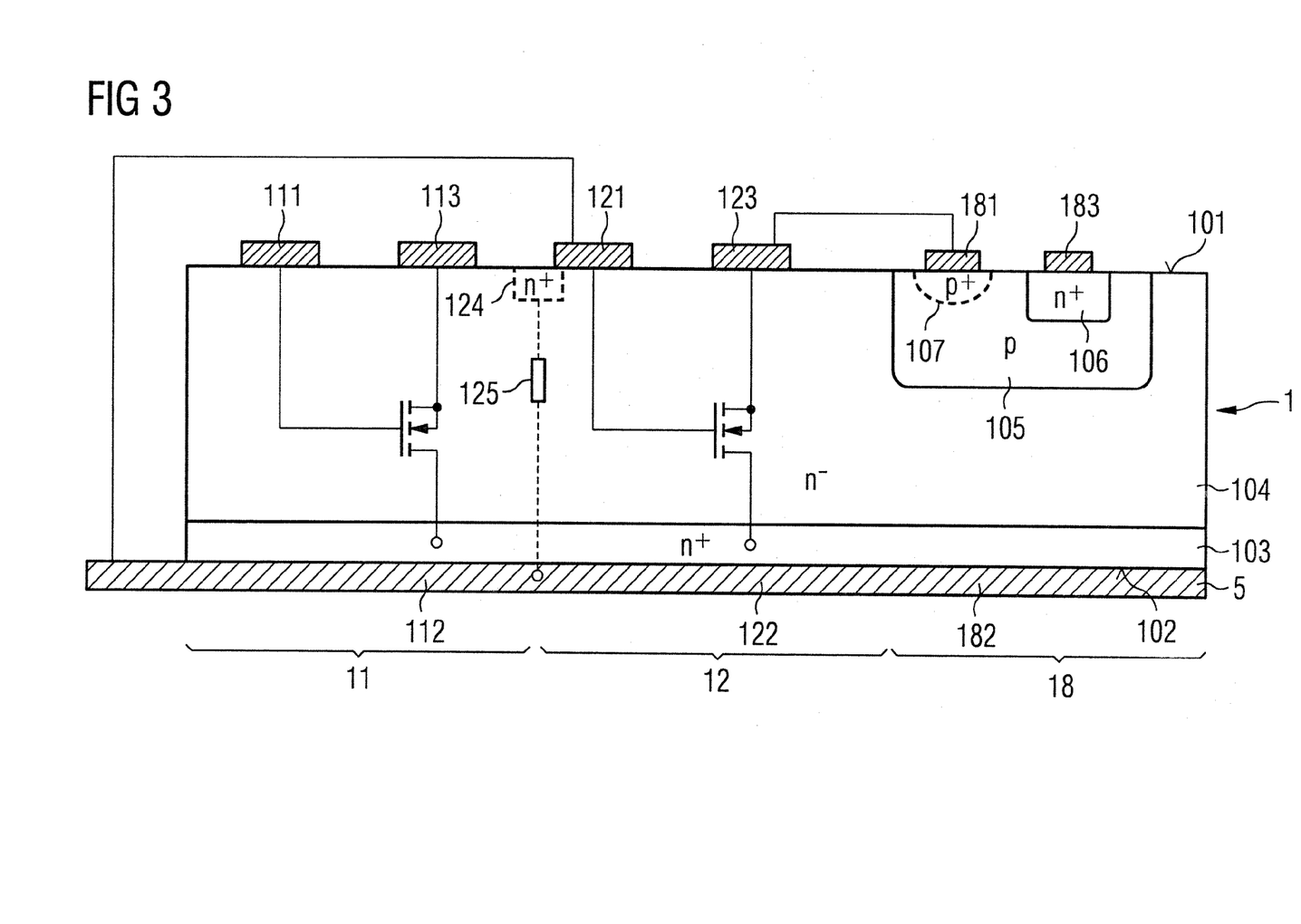
FIG. 3 illustrates, schematically, integration of the power transistor, of the sensor transistor and of the temperature sensor in the circuit illustrated in FIG. 2 in a common semiconductor body.

One embodiment of the load transistor 11, of the sensor transistor 12 and of the bipolar transistor 18 which is used as a temperature sensor, in a common semiconductor chip 1, will be explained in the following text with reference to FIG. 3. FIG. 3 illustrates the semiconductor body 1 schematically, in the form of a cross section on a vertical section plane. The reference symbols 101, 102 denote a first face, which is referred to in the following text as the front face, and a second face, which is referred to in the following text as the rear face, of this semiconductor body 1. The illustrated semiconductor body includes two semiconductor layers, a relatively heavily doped first semiconductor layer 103 and a relatively lightly doped second semiconductor layer 104, which is applied to the first semiconductor layer 103. The first semiconductor layer 103 is, for example, a semiconductor substrate, and the second semiconductor layer 104 is, for example, an epitaxial layer applied to the substrate 103. It should be noted that the dimensions of these semiconductor layers are not illustrated to scale in FIG. 3.

The rear face 102 of the semiconductor body 1 is applied to an electrically conductive mount 5, for example a leadframe, and is electrically conductively connected to this mount.

The load transistor 11 and the sensor transistor 12 are vertical transistors which have a common drain zone which, in the example, is formed by the heavily doped first semiconductor layer 103. The mount 5 in this case forms the drain terminals 112, 122 of the load transistor 11 and of the sensor transistor 12. Source zones, body zones and gate electrodes of these transistors 11, 12 are integrated in the second semiconductor layer 104, which in places holds the drift zone of these transistors. These component zones of the two transistors 11, 12 are illustrated only in the form of electrical circuit symbols in FIG. 3, for clarity reasons.

The two transistors may be conventional vertical transistors, for example, DMOS transistors with a planar gate electrode or a gate electrode arranged in a trench (trench electrode). The load transistor 11 and the sensor transistor 12 in this case, as is illustrated in FIG. 3, have separate source terminals 113, 123 and separate gate terminals 111, 121. By way of example, a line connection in the form of a bonding wire may be provided in order to connect the gate terminal 121 to the drain terminal 122 of the sensor transistor, and shorts the leadframe 5 to the gate terminal 121 of the sensor transistor 12. In the illustrated example, the leadframe 5 for this purpose extends beyond the semiconductor body 1 in the lateral direction.

Alternatively or in addition to the provision of a line connection between the drain terminal 122 and the gate terminal 121, it is possible to connect the gate terminal 121 to the drain terminal 122 via the first and second semiconductor layers 103, 104. For this purpose, the gate electrode 121 is connected to a connecting zone 124 (illustrated by dashed lines), which is more heavily doped than the second semiconductor layer 104, although this is illustrated only schematically in the figure. This connecting zone 124 allows a low contact resistance to be provided between the gate electrode 121 and the second semiconductor layer 104. The resistance, which is annotated with the reference symbol 125 in FIG. 3, represents a resistance between the gate terminal 121 and the drain terminal 122, which is caused mainly by the resistance of the relatively lightly doped second semiconductor layer 104. In this variant, there is no need for the drain electrode 5 to project beyond the semiconductor body 1.

The sensor components which are integrated in the semiconductor body 1 can be connected to the supply potential (V+ in FIGS. 1 and 2) via the gate terminal 121 and/or the drain terminal 122, by connecting the respective terminal via the leadframe 5 or a bonding wire to an externally accessible connecting terminal (not illustrated) for the semiconductor chip 1.

If the gate terminal 121 is connected to the drain terminal 122 in the manner explained above via the semiconductor body 1, a single bonding connection is sufficient on the gate terminal 121 or a connection to the drain terminal 122, which ensures this voltage supply. The two transistors 11, 12 may, for example, be integrated in a common cell array, which has a multiplicity of identical transistor structures, or transistor cells, of which a first number of transistor cells are connected in parallel in order to form the load transistor 11, and of which a second number of transistor cells 12 are connected in parallel in order to form the sensor transistor 12. The number of transistor cells which form the sensor transistor 12 may in this case be considerably less than the number of transistor cells which form the load transistor 11. By way of example, the ratio is $n1/n2=10^2 \ldots 10^5$. n1 in this case denotes the number of transistor cells in the load transistor 11, and n2 denotes the number of transistor cells in the sensor transistor 12.

Assuming that the transistor cells in the cell array are produced by common production processes, the individual transistor cells have the same threshold voltages, which correspond to the threshold voltages of the load transistor 11 and of the sensor transistor 12.

The bipolar transistor which is integrated in the first semiconductor body 1 is likewise a vertical component, whose collector terminal is formed by the first semiconductor zone 103. A base zone 105 and an emitter zone 106 are in this case integrated in the area of the front face 101 in the second semiconductor layer 104. A base electrode 181 makes contact with the base zone 105 by a base electrode 181, and an emitter electrode 183 makes contact with the emitter zone 106. A contact zone 107 which is more heavily doped than the base zone 105 and forms a resistive contact to the base electrode 181 can be provided between the base electrode 181 and the base zone 105. The base electrode 181 is electrically conductively connected to the source electrode 123 of the sensor transistor.

Figure 4:
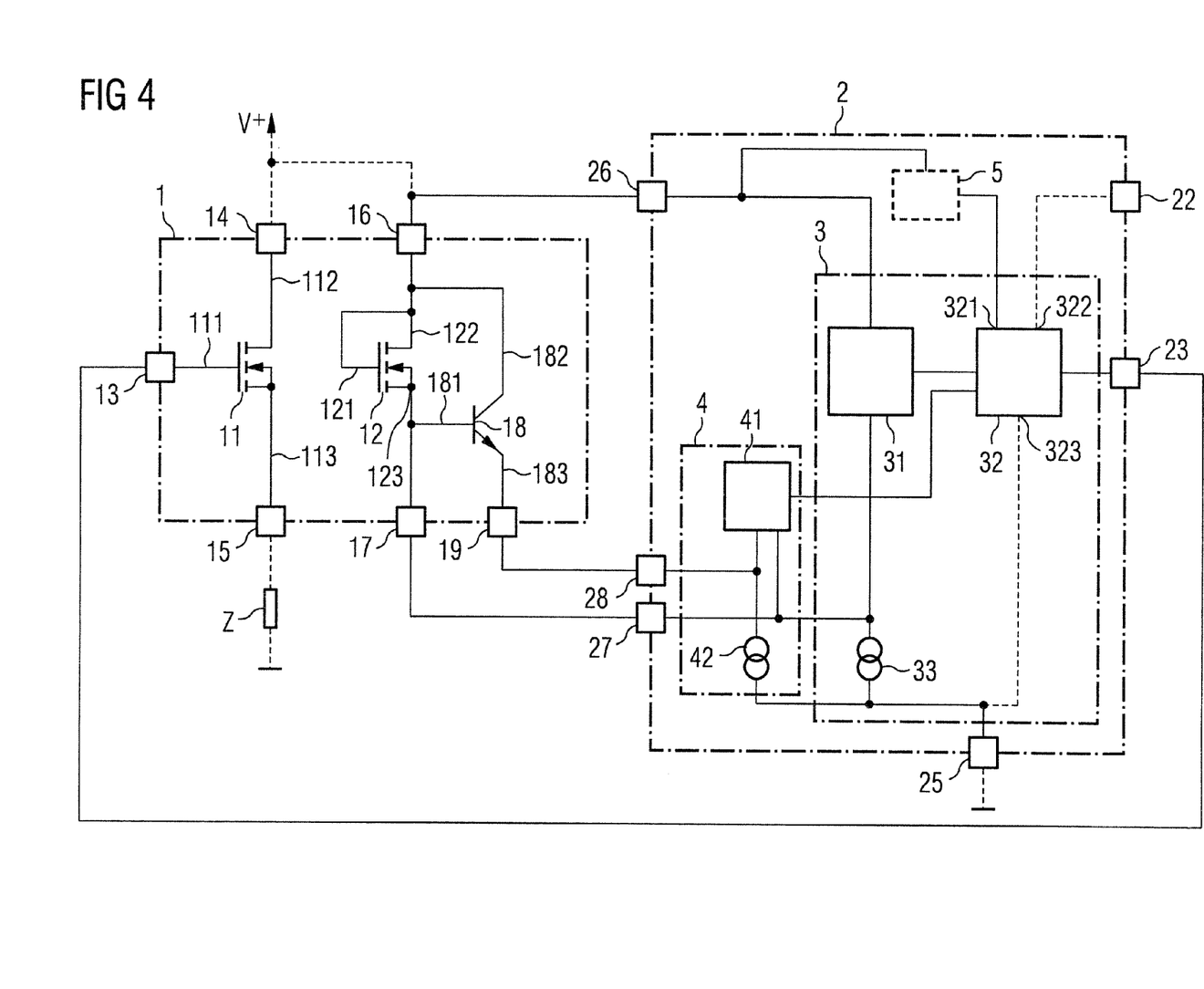
FIG. 4 illustrates a modification of the circuit arrangement illustrated in FIG. 2.

FIG. 4 illustrates a modification of the circuit arrangement illustrated in FIG. 2. In the circuit arrangement illustrated in FIG. 4, the voltage supply for the circuit components integrated in the second semiconductor chip 2 is provided via one of the connecting pads 26, 27 via which the evaluation circuit 3 in the first sensor arrangement taps off the voltage across the sensor transistor 12. In the circuit illustrated in FIG. 4, the connecting pad 26 is used as a "voltage supply pad" and is connected to the drain terminal 122 of the sensor transistor 12. During operation of the circuit arrangement, this drain terminal is at the positive supply potential V+. In this arrangement, there is no need to provide a separate connecting pad for the voltage supply of the circuit components in the second semiconductor chip 2. In this context, it should also be noted that the connecting pads 14, 16 for the drain terminals of the load transistor 11 and of the sensor transistor 12 form a common terminal in the form of the mount or leadframe 5 in an implementation of these components as illustrated in FIG. 3, as illustrated by dashed lines in FIG. 4 and FIG. 2.

As an alternative to the connecting pad 26 connected to the drain terminal 122 of the sensor transistor 12, the connecting pad 27 connected to the source terminal 123 of the sensor transistor 12 can also be used for the voltage supply for the second semiconductor chip 2, although this is not illustrated explicitly in FIG. 4. However, in this variant the current drawn by the drive chip 2 interferes with the evaluation of the threshold voltage of the sensor transistor 12.

In the exemplary embodiments explained above, the load transistor 11 and the sensor transistor 12 are each in the form of n-MOSFETs. This should be regarded just as an example. These components may, of course, also be in the form of p-MOSFETs, in which case the supply voltage polarity must then be reversed in comparison to the explanatory notes above. In this variant, a pnp bipolar transistor can be used as the temperature sensor 18.

Figure 5:
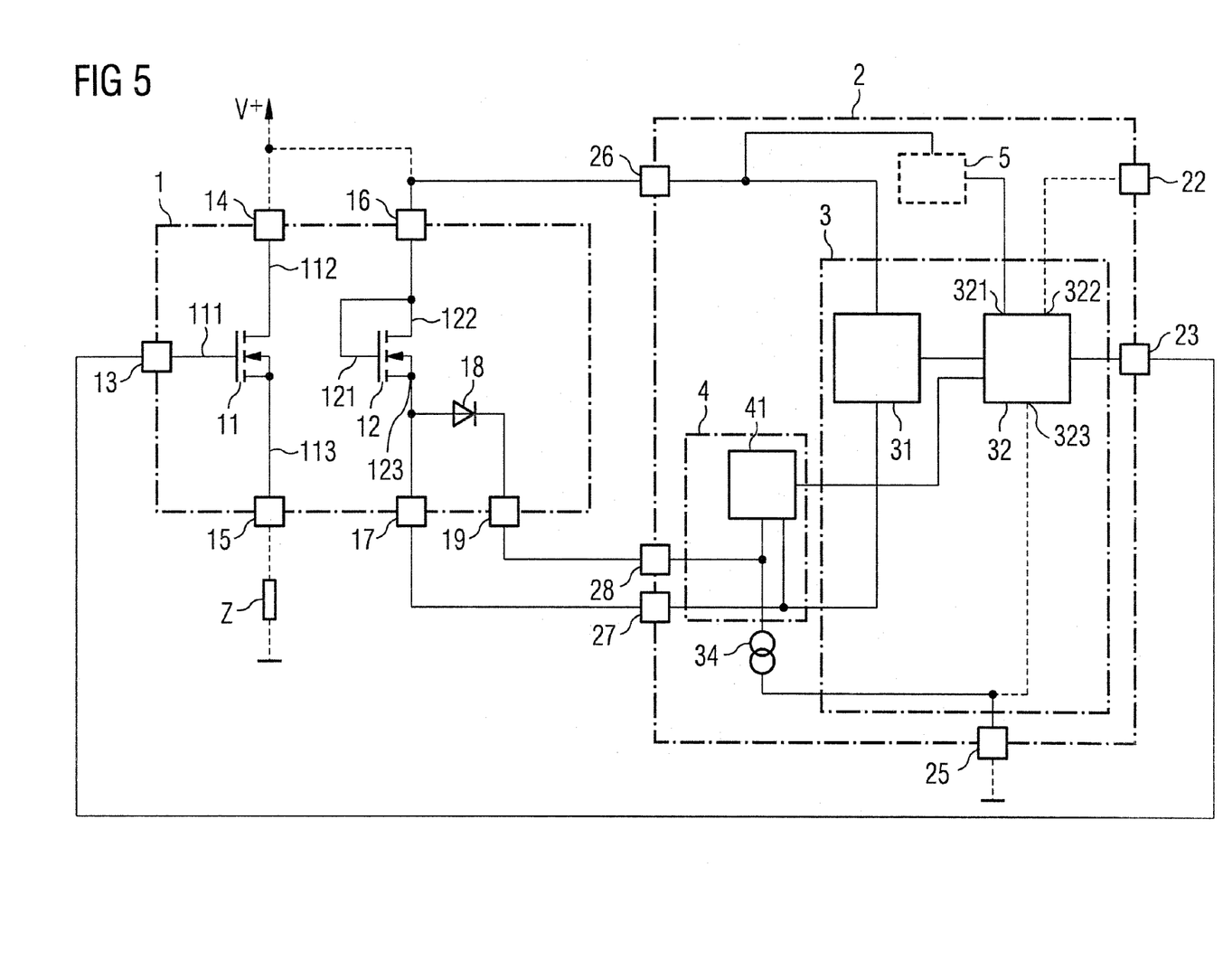
FIG. 5 illustrates one exemplary embodiment of a circuit arrangement which has a diode as a temperature sensor.

Instead of the bipolar transistor explained above, a diode which is operated in the forward-biased direction can also be used as the temperature sensor 18, with the voltage drop across it in the forward-biased state being determined by a constant current forced to flow through it by the current source 42. FIG. 5 illustrates one exemplary embodiment of a circuit arrangement with a diode operated in the forward-biased direction as a temperature sensor. In the illustrated example, the diode is connected in series with the load path 122-123 of the sensor transistor and is connected between one 17 of the connecting pads of the sensor transistor 12 and the connecting pad 19 of the temperature sensor 12. The voltage measurement arrangement 41, which is connected to the connecting pads 17, 19 in the manner that has already been explained, of the evaluation circuit detects the voltage between these terminals 17, 19, and this voltage corresponds to the voltage dropped across the diode 18 in the forward-biased state. This voltage in the forward-biased state represents a direct measure of the temperature on the assumption that the current flowing through the diode 18 is at least approximately constant.

In the illustrated arrangement, this current is provided by a current source 34 which is shared by the sensor transistor 12 and the diode 18 and is connected in series with the series circuit including the sensor transistor 12 and the diode 18. This common current source 34 is arranged in the second semiconductor chip 2 and is connected to the connecting pad 19 of the temperature measurement arrangement.

The voltage across the sensor transistor is determined in the circuit arrangement illustrated in FIG. 5 by the already explained evaluation circuit 3 of the sensor transistor 12, which evaluation circuit 3 is connected to the connecting pads 16, 17 of the sensor transistor 12.

Figure 6:
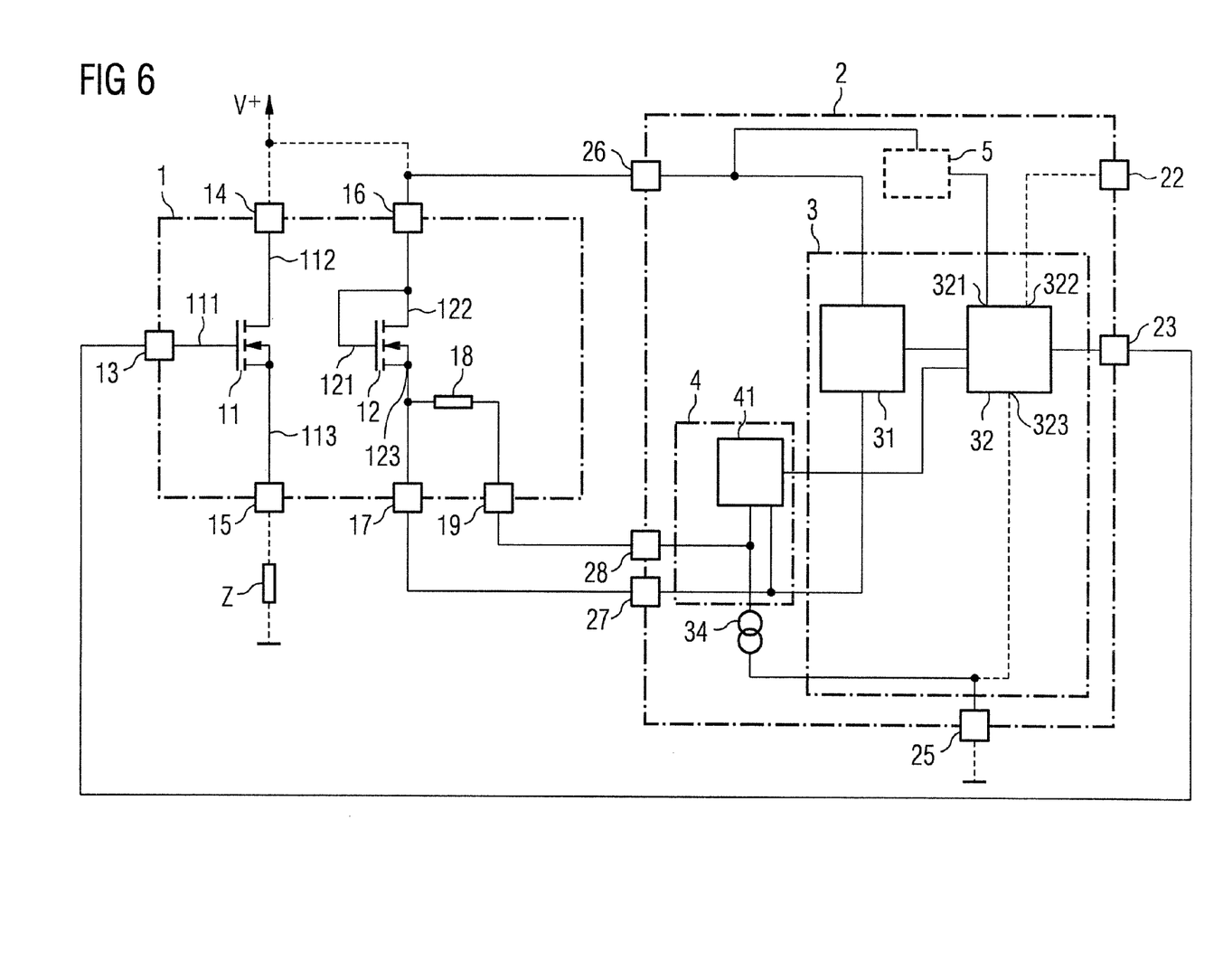
FIG. 6 illustrates one exemplary embodiment of a circuit arrangement which has a resistor as a temperature sensor.

A resistor with a temperature-dependent resistance response is likewise suitable for use as a temperature sensor, through which the constant stabilized current flows and across which the voltage drop caused by this current is determined as the measured temperature value. This resistor may have a positive or a negative temperature coefficient. FIG. 6 illustrates a circuit arrangement with a resistor such as this as the temperature sensor 18. The illustrated circuit arrangement differs from the circuit arrangement illustrated in FIG. 5 by having a temperature measurement resistor 18 instead of a temperature measurement diode. The voltage across the measurement resistor, which is caused by the common current source 34 and is produced between the connecting pads 17, 19, represents a direct measure of the temperature when using this circuit arrangement.

Figure 7:
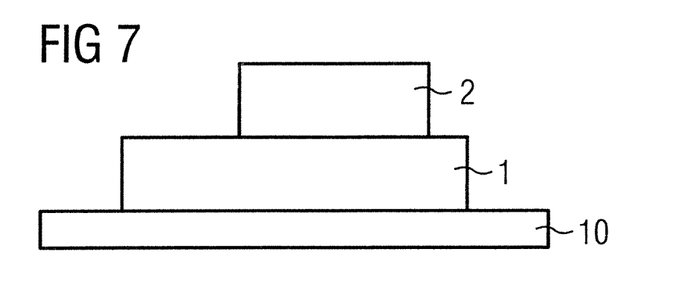
FIG. 7 illustrates one implementation of the circuit arrangement using chip-on-chip technology.

With reference to FIG. 7, the circuit arrangement with the two semiconductor chips 1, 2 can be implemented using chip-on-chip technology. In this case, the second semiconductor chip 2 is mounted on the front face of the semiconductor chip 1. In this case, the semiconductor chip 1 is seated on a mount 10, which may be identical to the electrically conductive mount 5 or leadframe illustrated in FIG. 3.

Figure 8:
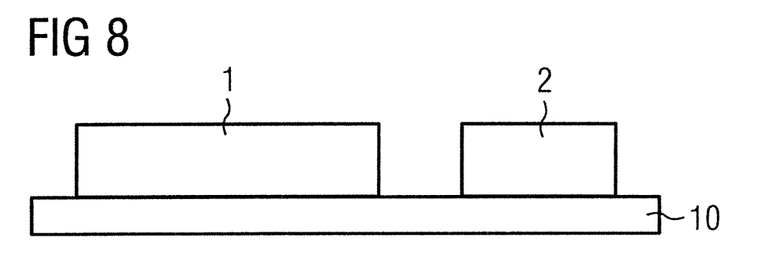
FIG. 8 illustrates one implementation of the circuit arrangement using chip-by-chip technology.

With reference to FIG. 8, it is also possible to implement the circuit arrangement with the two semiconductor chips using chip-by-chip technology. In this case, the two chips are arranged on a mount 10, separated from one another in the lateral direction.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit comprising:
a power transistor with a drive terminal and a load path, the power transistor being integrated in a first semiconductor body;
a first sensor arrangement having a sensor transistor integrated in the first semiconductor body and an evaluation circuit, the sensor transistor having a load path between a drain terminal and a source terminal, and a gate terminal directly connected to the drain terminal, the evaluation circuit having only two connections to the sensor transistor, a first connection to the drain terminal and a second connection to the source terminal of the sensor transistor such that the evaluation circuit receives a load path voltage across the drain and source terminals of the sensor transistor that corresponds to a threshold voltage of the sensor transistor and providing a first sensor signal dependent on the load path voltage that corresponds to the threshold voltage of the sensor transistor; and
a drive circuit to which the first sensor signal is supplied and that is configured to drive the power transistor via its drive terminal as a function of the first sensor signal.

2. The circuit of claim 1, wherein the drive circuit is integrated in a second semiconductor body.

3. The circuit of claim 2, wherein the evaluation circuit is arranged in the second semiconductor body.

4. The circuit of claim 2, wherein a voltage supply arrangement for supplying the voltage at least to the drive circuit is integrated in the second semiconductor body and the second semiconductor body comprises a supply terminal to which the voltage supply arrangement is connected.

5. The circuit of claim 4, wherein the voltage supply arrangement is connected to a measurement terminal coupled to one of the load terminals of the sensor transistor.

6. The circuit of claim 1 further comprising:
a second sensor arrangement with a temperature sensor integrated in the first semiconductor body, wherein the second sensor arrangement produces a second sensor signal dependent on a temperature in the first semiconductor body and is supplied to the drive circuit with the drive circuit being designed to drive the power transistor as a function of the second sensor signal.

7. The circuit of claim 6, wherein the second sensor arrangement comprises an evaluation circuit coupled to the temperature sensor, produces the second sensor signal and is integrated in a second semiconductor body.

8. The circuit of claim 6, wherein the sensor transistor and the temperature sensor have at least one common terminal.

9. The circuit of claim 8, wherein the sensor transistor comprises a control terminal and a load path in the first sensor arrangement and is connected as an MOS diode.

10. The circuit of claim 9, wherein the evaluation circuit of the first sensor arrangement comprises a current source connected in series with the sensor transistor, and comprises a voltage measurement arrangement connected in parallel with the load path of the sensor transistor and produces the first sensor signal.

11. The circuit of claim 6, wherein the temperature sensor is a bipolar transistor with a base terminal, a collector terminal and an emitter terminal.

12. The circuit of claim 11, wherein the second sensor arrangement has an evaluation circuit having a current source connected in series with the temperature sensor and comprises a voltage measurement arrangement connected in parallel with the temperature sensor.

13. The circuit of claim 11, wherein the voltage measurement arrangement is connected in parallel with the base-emitter junction of the bipolar transistor.

14. The circuit of claim 11, wherein the collector terminal of the temperature sensor is connected to a first of the load terminals of the sensor transistor, and the base terminal of the temperature sensor is connected to the other of the load terminals of the sensor transistor.

15. The circuit of claim 6, wherein the temperature sensor is a diode.

16. A circuit of claim 15, wherein the temperature sensor is connected in series with a load path of the sensor transistor and a common current source is connected in series with the series circuit comprising the sensor transistor and the temperature sensor.

17. The circuit of claim 6, wherein the temperature sensor is a resistance element with a temperature-dependent resistance response.

18. The circuit of claim 1, wherein the power transistor and the sensor transistor are of a same transistor type, and wherein the threshold voltage of the sensor transistor corresponds to a threshold voltage of the power transistor.

19. An integrated circuit comprising:
a power transistor with a drive terminal and with a load path, the power transistor being integrated in a first semiconductor body;
a sensor transistor integrated in the first semiconductor body and having a load path between a drain terminal and a source terminal, and a gate terminal connected to the drain terminal;
an evaluation circuit having only two connections to the sensor transistor, a first connection to the drain terminal and a second connection to the source terminal of the sensor transistor so that the evaluation circuit receives a load path voltage across the drain and source terminals of the sensor transistor corresponding to a threshold voltage of the sensor transistor and is configured to provide a first sensor signal dependent on the load path voltage; and
a drive circuit to which the first sensor signal is supplied and that is configured to drive the power transistor via its drive terminal as a function of the first sensor signal;
wherein the power transistor and the sensor transistor are produced by substantially the same processes so that the threshold voltage of the sensor transistor corresponds to a threshold voltage of the power transistor.

20. An integrated circuit comprising:
a power transistor with a drive terminal and with a load path, the power transistor being integrated in a first semiconductor body;
a sensor transistor integrated in the first semiconductor body and having a drain terminal, a source terminal, and a gate terminal connected to the drain terminal;
an evaluation circuit having only two connections to the sensor transistor, a first connection to the drain terminal and a second connection to the source terminal of the sensor transistor so that the evaluation circuit receives a drain to source voltage of the sensor transistor corresponding to a threshold voltage of the sensor transistor and is configured to provide a first sensor signal dependent on the drain to source voltage;
a drive circuit to which the first sensor signal is supplied and that is configured to drive the power transistor via its drive terminal as a function of the first sensor signal; and means integrated in the first semiconductor body for producing a second sensor signal dependent on a temperature in the first semiconductor body, the second sensor signal being supplied to and driving the drive circuit as a function of the second sensor signal.

21. A circuit comprising:
a power transistor with a drive terminal and with a load path, the power transistor being integrated in a first semiconductor body;
a first sensor arrangement having a sensor transistor integrated in the first semiconductor body, and having an evaluation circuit connected to only a source terminal and a drain terminal of the sensor transistor so as to receive a voltage across the source and drain terminals corresponding to a threshold voltage of the sensor transistor and providing a first sensor signal dependent on the threshold voltage of the sensor transistor; and
a drive circuit to which the first sensor signal is supplied and that is configured to drive the power transistor via its drive terminal as a function of the first sensor signal.

22. The circuit of claim 21, wherein the drive circuit configured to adjust a switching speed of the power transistor based on the first sensor signal.

23. A circuit comprising:
a power transistor with a drive terminal and with a load path, the power transistor being integrated in a first semiconductor body;
a first sensor arrangement having a sensor transistor integrated in the first semiconductor body, and having an evaluation circuit connected to a source to only a source terminal and a drain terminal of the sensor transistor, the evaluation circuit receiving a first voltage across the source and drain terminals of the sensor transistor corresponding to a threshold voltage of the sensor transistor and providing a first sensor signal dependent on the first voltage which corresponds to the threshold voltage of the sensor transistor; and
a drive circuit to which the first sensor signal is supplied and that is configured to drive the power transistor via its drive terminal as a function of the first sensor signal, the drive circuit configured to adjust a switching speed of the power transistor based on the first sensor signal.

24. A circuit comprising:
a power transistor of a transistor type integrated in a first semiconductor body and having a gate terminal;
a sensor arrangement including a sensor transistor and an evaluation circuit, the sensor transistor being of the same transistor type as the power transistor and integrated in the first semiconductor body and having a load path between a drain terminal and a source terminal and a gate terminal connected to the drain terminal, wherein the evaluation circuit is connected only to the source terminal and to the drain terminal of the sensor transistor, wherein the evaluation circuit includes a current source configured to impress a current flow through the load path of the sensor transistor that results in a load path voltage between the drain and source terminals of the sensor transistor which corresponds to a threshold voltage of the sensor transistor and to a threshold voltage of the power transistor, and wherein the evaluation circuit provides a sensor signal dependent on the load path voltage of the sensor transistor; and
a drive circuit configured to drive the gate terminal of the power transistor based on the sensor signal.

25. The circuit of claim 24, wherein the sensor arrangement is electrically separate from the power transistor.

* * * * *